United States Patent
Chen et al.

(10) Patent No.: US 6,895,540 B2
(45) Date of Patent: May 17, 2005

(54) MUX SCAN CELL WITH DELAY CIRCUIT FOR REDUCING HOLD-TIME VIOLATIONS

(75) Inventors: Wang-Jin Chen, Kao-Hsiung (TW); Chen-Teng Fan, Hsin-Chu Hsien (TW); Cheng-I Huang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 305 days.

(21) Appl. No.: 10/064,475

(22) Filed: Jul. 18, 2002

(65) Prior Publication Data

US 2004/0015759 A1 Jan. 22, 2004

(51) Int. Cl.[7] .......................... G01R 31/28; G06F 9/45; H01L 25/00
(52) U.S. Cl. .......................... 714/726; 327/565; 716/10
(58) Field of Search ................................ 714/724–726, 714/731; 716/10; 327/199, 565

(56) References Cited

U.S. PATENT DOCUMENTS 5,923,676 A * 7/1999 Sunter et al. ............... 714/733
6,023,778 A * 2/2000 Li .............................. 714/726
6,698,006 B1 * 2/2004 Srinivasan et al. .......... 716/10

OTHER PUBLICATIONS

"Cost–free Scan: A Low–Overhead Scan Path Design" by Lin et al. in IEEE Transactions on Computer–Aided Design of Integrated Circuits and Systems, Sep. 1998, page(s): 852–861, vol. 17 Issue 9, Inspec Accession No.: 604173.*
"Test–Point Insertion: Scan Paths Through Functional Logic" by Lin et al. IEEE Transactions on Computer–Aided Design of Integrated Circuits and Systems, Sep. 1998, pp. 838–851, vol. 17 Issue 9, Inspec Accession No.: 6041730.*

* cited by examiner

Primary Examiner—Guy J. Lamarre
Assistant Examiner—Cynthia Britt
(74) Attorney, Agent, or Firm—Winston Hsu

(57) ABSTRACT

A mux scan cell includes a multiplexer having a first input node for receiving raw data, a second input node for receiving test data, an output node, a selection node, and a delay circuit electrically connected between the second input node and the output node for prolonging a traveling time which the test data takes to travel from the second input node to the output node. The mux scan cell also includes a flip-flop connected to the multiplexer. With the delay circuit, the traveling time of the test data is prolonged such that the traveling time which the test data takes to travel from the second input node to the output node simulates a sum of a traveling time in which the raw data travels through a combinational logic and a traveling time in which the raw data travels from the first input node to the output node.

7 Claims, 6 Drawing Sheets

MUX SCAN CELL WITH DELAY CIRCUIT FOR REDUCING HOLD-TIME VIOLATIONS

BACKGROUND OF INVENTION

1. Field of the Invention

The present invention relates to a mux scan cell, and more specifically, to a mux scan cell that contains a delay circuit for reducing occurrence of hold-time violations during testing procedures.

2. Description of the Prior Art

After integrated circuit chips are manufactured, tests are performed on the chips to verify whether the chips are good or bad, and the bad chips are thrown away.

Please refer to FIG. 1. FIG. 1 is a block diagram of a mux scan cell 10 according to the prior art. The mux scan cell 10 comprises a multiplexer 12 connected to a flip-flop 14. The multiplexer 12 has a first input 16 for receiving normal data D, a second input 18 for receiving test data TD, a selection input 20 for receiving a selection signal SEL, and an output 22 for outputting either normal data D or test data TD to an input 24 of the flip-flop 14. The flip-flop 14 has a clock input 26 for receiving a clock CLK and an output 28 for outputting a value that is present at the input 24 of the flip-flop 14 during an active edge of the clock CLK.

Please refer to FIG. 2. FIG. 2 is a block diagram of a mux scan chain 30 according to the prior art. The mux scan chain 30 comprises a first mux scan cell 11 and a second mux scan cell 13 that are identical to the mux scan cell 10 of FIG. 1. The first and second mux scan cells 11 and 13 are serially connected together to form the mux scan chain 30. The multiplexers 12 in each of the first and second mux scan cells 11 and 13 are connected to the selection signal SEL in order to switch between testing mode and normal mode.

In testing mode, data $Q_0$ is input directly to the first mux scan cell 11 for inputting test data TD. This data $Q_0$ travels through both the multiplexer 12 and the flip-flop 14, and is outputted from the first mux scan cell 11 as data $Q_1$. Likewise, data $Q_1$ is input directly to the second mux scan cell 13 for inputting test data TD. This data $Q_1$ travels through both the multiplexer 12 and the flip-flop 14, and is outputted from the second mux scan cell 13 as data $Q_2$.

In normal mode, a slightly different approach is used. Since normal mode is the actual operation mode of the mux scan chain 30, combinational logic 32 is used to transform data $Q_0$ and $Q_1$ into normal data D of the first and second mux scan cells 11 and 13, respectively. That is, data $Q_0$ first travels through combinational logic 32, next enters the first mux scan cell 11, and then is outputted from the first mux scan cell 11 as data $Q_1$. Likewise, data $Q_1$ first travels through combinational logic 32, next enters the second mux scan cell 13, and then is outputted from the second mux scan cell 13 as data $Q_2$. In order for the mux scan chain 30 to function properly, data $Q_0$ and $Q_1$ must satisfy setup and hold times of the flip-flops.

Unfortunately, clock skew can cause problems for the mux scan chain 30. The presence of clock skew in the mux scan chain 30 can affect test mode operation differently than normal mode operation because the path delay associated with test mode is shorter than the path delay associated with normal mode. Please refer to FIGS. 4A and 4B. FIGS. 4A and 4B are timing diagrams of the mux scan chain 30 without clock skew and with clock skew, respectively. Symbols $Q_{n-1}$ and $Q_n$ are used to symbolize pairs of signals such as the signals $Q_0$ and $Q_1$ or the signals $Q_1$ and $Q_2$. For this discussion, a rising edge of the clock CLK will be treated as an active edge of the clock.

As shown in the timing diagram of FIG. 4A, at time $t_0$, $Q_{n-1}$ has a binary "1" value when the clock CLK rises. Thus, since $Q_n$ previously had a binary "1" value, and $Q_{n-1}$ had a binary "1" value when the clock CLK rose, $Q_n$ continues to have a binary "1" value after time $t_0$. Notice that the value of $Q_{n-1}$ changes at time $t_1$, which is after the active edge of the clock CLK at time $t_0$. When the next active edge of the clock CLK occurs at time $t_4$, $Q_{n-1}$ has a binary "0" value. Thus, the value of $Q_n$ changes to binary "0" shortly after time $t_4$. Therefore, during test mode operation of the mux scan chain 30, both setup and hold times of the $Q_{n-1}$ signal are satisfied with respect to the active edge of the clock CLK.

In FIG. 4B, the clock CLK is skewed by the amount of time $t_2$ to. At time $t_2$, $Q_{n-1}$ has a binary "0" value when the clock CLK rises. Thus, since $Q_n$ previously had a binary "1" value, and $Q_{n-1}$ had a binary "0" value when the clock CLK rose, the value of $Q_n$ changes to binary "0" shortly after time $t_2$. Unlike FIG. 4A, which had no clock skew, with clock skew, the value of clock CLK changes at time $t_2$, which is after the time when the value of $Q_{n-1}$ changed at $t_1$. When the next active edge of the clock CLK occurs at time $t_5$, $Q_{n-1}$ has a binary "1" value. Thus, the value of $Q_n$ changes to binary "1" shortly after time $t_5$.

Therefore, during test mode operation of the mux scan chain 30, the hold time condition of the $Q_{n-1}$ signal is not satisfied with respect to the active edge of the clock CLK when there is clock skew. This is because the value of $Q_{n-1}$ changes just before the active edge of the clock CLK. Specifically, $Q_{n-1}$ changes at time $t_1$ (as shown in FIG. 4B), which is before the active edge of the clock CLK at time $t_2$. This hold time violation is caused by the fact that during test mode, signal $Q_{n-1}$ does not travel through the combinational logic 32, which makes the signal $Q_{n-1}$ reach the flip-flop 14 of the first mux scan cell 11 sooner than it would in normal mode. In addition, the path delay taken during test mode is smaller than in normal mode, and this path delay is less than the amount of time that the clock is skewed by.

Thus, timing conditions from running the mux scan chain 30 in normal mode and test mode are not the same. Clearly, the test mode is not capable of providing proper timing tests on the mux scan chain 30 since hold time violations are occurring. This reduces the worth of the test mode, and can possibly lead to incorrect design of the mux scan chain 30 if proper care is not taken to consider propagation delay caused by the combinational logic 32.

SUMMARY OF INVENTION

It is therefore a primary objective of the claimed invention to provide a mux scan cell including a multiplexer with a delay circuit in order to solve the above-mentioned problems.

According to the claimed invention, a mux scan cell includes a multiplexer having a first input node for receiving raw data, a second input node for receiving test data, an output node for outputting data, a selection node for selecting an input from the first input node or the second input node, and a delay circuit electrically connected between the second input node and the output node for prolonging a traveling time which the test data takes to travel from the second input node to the output node. The mux scan cell also includes a flip-flop having a first input end connected to the output node of the multiplexer, a second input end for receiving clock pulses, and an output end for outputting a signal received by the first input end of the flip-flop. With the delay circuit, the traveling time of the test data is prolonged such that the traveling time which the test data takes to travel from the second input node to the output node is longer than a period of time that the clock is skewed by.

It is an advantage of the claimed invention that the mux scan cell includes the delay circuit. Use of the delay circuit allows test data to be processed properly in the presence of clock skew.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
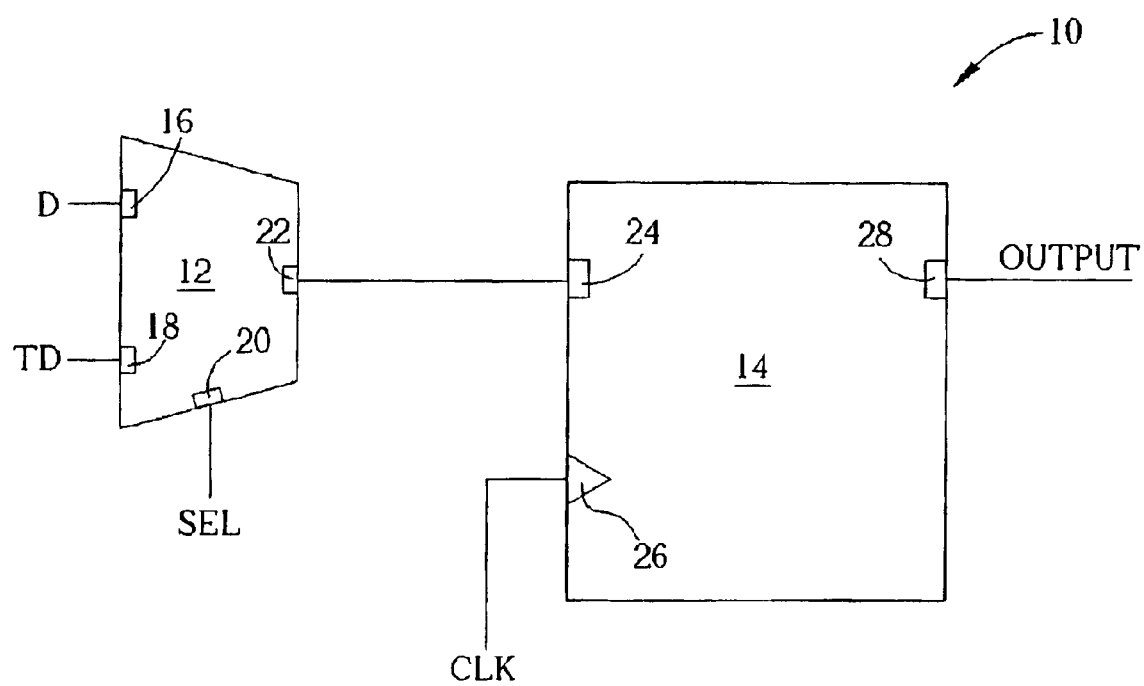
FIG. 1 is a block diagram of a mux scan cell according to the prior art.
Figure 2:
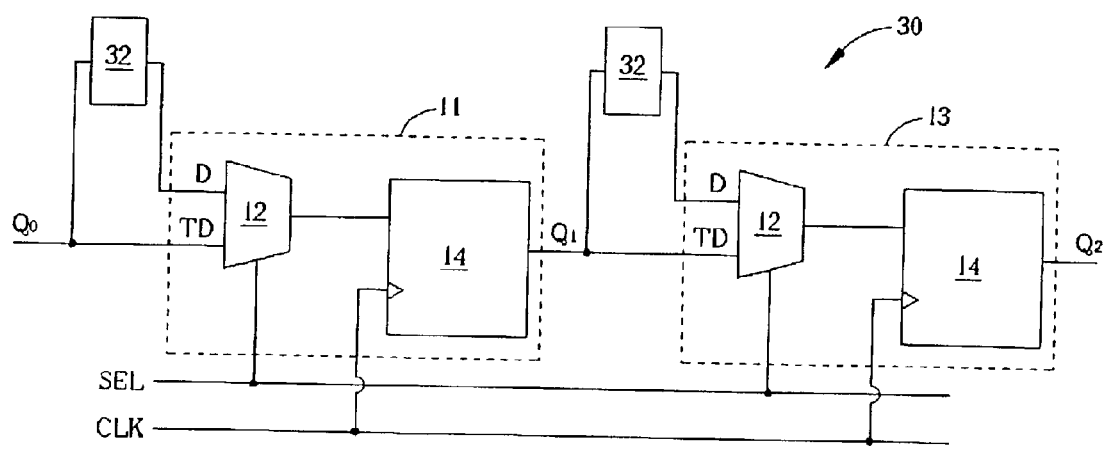
FIG. 2 is a block diagram of a mux scan chain according to the prior art.
Figure 3:
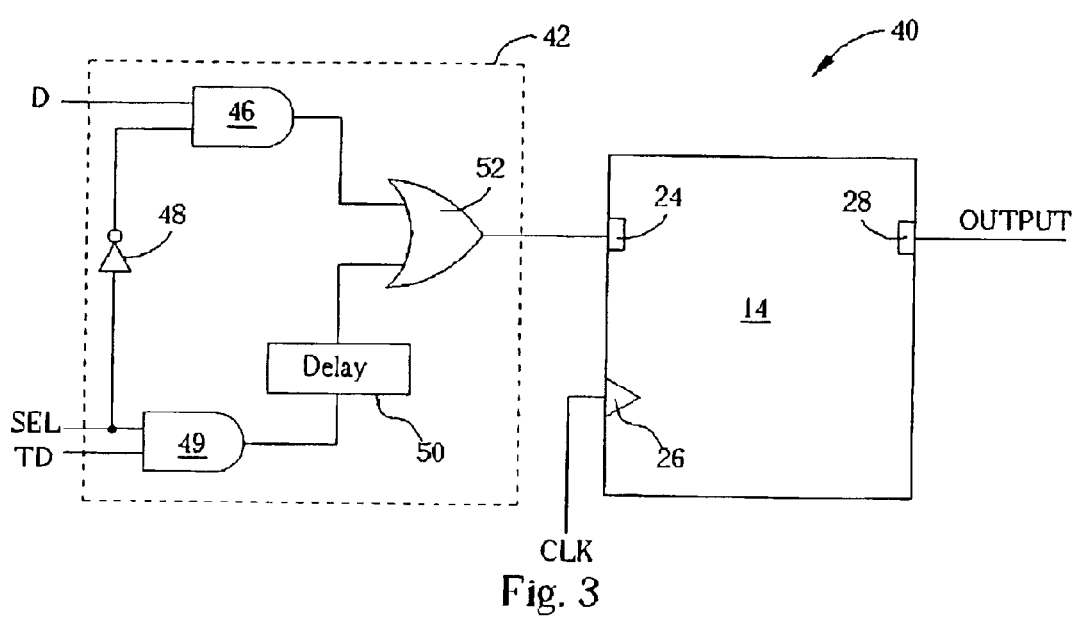
FIG. 3 is a functional block diagram of a mux scan cell according to the present invention.

Please refer to FIG. 3. FIG. 3 is a functional block diagram of a mux scan cell 40 according to the present invention. The only difference between the mux scan cell 40 of the present invention and the mux scan cell 10 of the prior art is use of a different multiplexer 42. Unlike the multiplexer 12 of the prior art, the multiplexer 42 includes a delay circuit 50. Since all other aspects of the mux scan cell 40 and the mux scan cell 10 are the same, the mux scan chain 30 of FIG. 2 will also be used to describe the present invention.

Please refer to FIGS. 2 and 3. As with the prior art, a selection signal SEL is used to switch between test mode and normal mode of the mux scan cell 40. When SEL=0, normal mode is selected since a binary "0" is fed to an AND gate 49 and a binary "1" is fed to an AND gate 46. Thus, an output of AND gate 46 is D AND "1", which is simply D. While this is occurring, an output of AND gate 49 is "0" AND TD, which is always "0". This output of AND gate 49 is then inputted to the delay circuit 50, which delays transmission of the output of AND gate 49 to the input of an OR gate 52. Next, a result of D OR "0" is outputted from the OR gate 52, and D is outputted from the multiplexer 42 to the flip-flop 14. Since SEL=0, the mux scan cell 40 is in normal mode, and the value of D was transmitted without delay to the flip-flop 14.

When SEL=1, test mode is selected since binary "1" is fed to AND gate 49 and binary "0" is fed to AND gate 46. Thus, the output of AND gate 46 is D AND "0", which is always "0". While this is occurring, the output of AND gate 49 is "1" AND TD, which is simply TD. This output of AND gate 49 is then inputted to the delay circuit 50, which delays the transmission of TD to the input of OR gate 52. Next, a result of "0" OR TD is outputted from the OR gate 52, and TD is outputted from the multiplexer 42 to the flip-flop 14. Since SEL=1, the mux scan cell 40 is in test mode, and the value of TD was transmitted after a delay to the flip-flop 14.

Figure 4A:
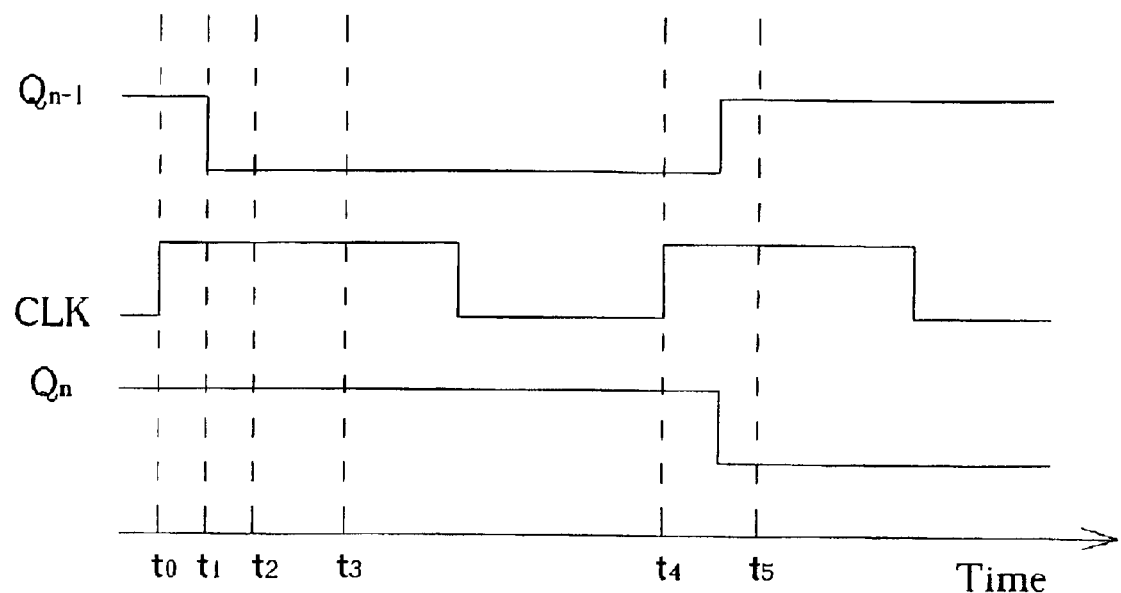
FIGS. 4A and 4B are timing diagrams of the mux scan chain without clock skew and with clock skew, respectively, according to the prior art.
Figure 4B:
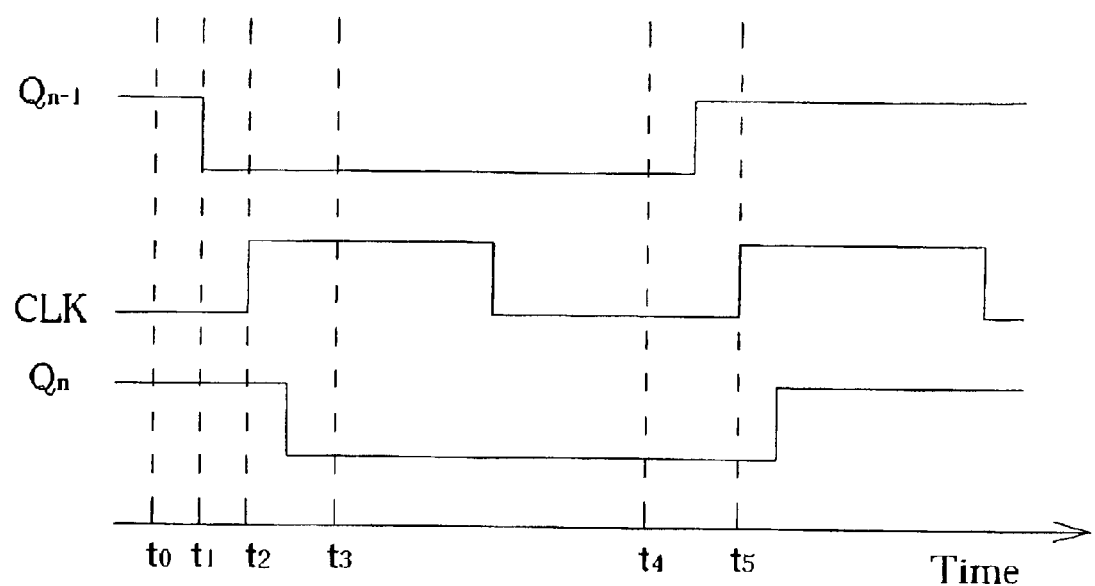
Figure 4C:
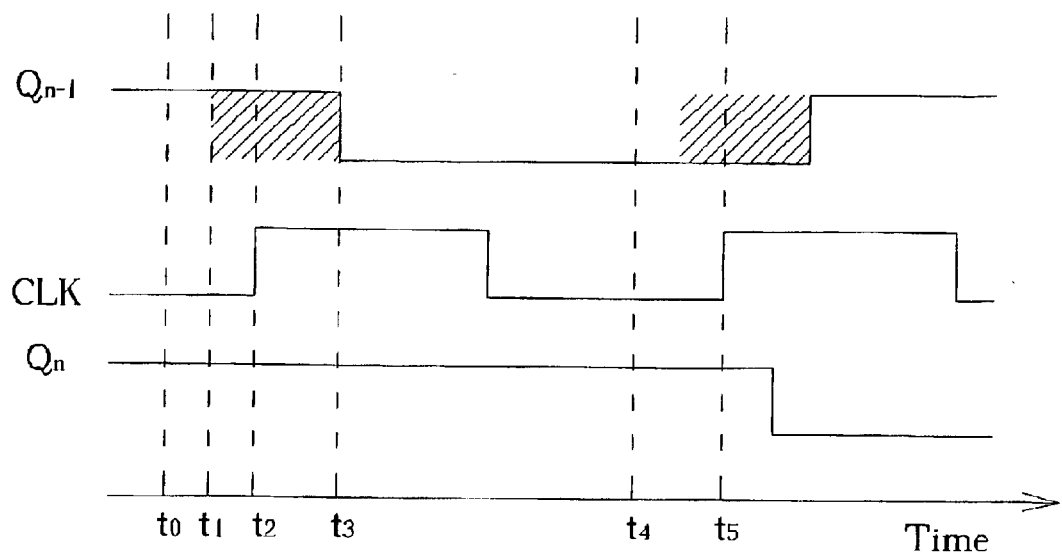
FIG. 4C is a timing diagram of the mux scan chain shown in FIG. 2 operating in test mode according to the present invention.

Please refer to FIG. 2 and FIG. 4C. FIG. 4C is a timing diagram of the mux scan chain 30 shown in FIG. 2 operating in test mode according to the present invention. As mentioned before, the mux scan chain 30 of FIG. 2 will be used to describe the present invention. For the sake of the following explanation of FIG. 4C, the first mux scan cell 11 and the second mux scan cell 13 are identical to the mux scan cell 40 of FIG. 3.

At time $t_1$, the value of $Q_{n-1}$ would fall from a binary "1" to a binary "0", but the delay circuit 50 adds an extra period of delay to the signal $Q_{n-1}$. This delay period is shown by the hatched area from time $t_1$ to time $t_3$. Therefore, at time $t_2$, $Q_{n-1}$ still has a binary "1" value when the clock CLK rises. Since $Q_n$ previously had a binary "1" value, and $Q_{n-1}$ had a binary "1" value when the clock CLK rose, $Q_n$ continues to have a binary "1" value after time $t_2$. Notice that because of the delay circuit 50, the value of $Q_{n-1}$ changes at time $t_3$, which is after the active edge of the clock CLK at time $t_2$. When the next active edge of the clock CLK occurs at time $t_5$, another period of delay causes $Q_{n-1}$ to hold a binary "0" value. Thus, the value of $Q_n$ changes to binary "0" shortly after time $t_5$. Therefore, during test mode operation of the mux scan chain 30 according to the present invention, both setup and hold times of the $Q_{n-1}$ signal are satisfied with respect to the active edge of the clock CLK. This is because during test mode of the present invention, signal $Q_{n-1}$ must travel through the delay circuit 50, which delays the moment when the signal $Q_{n-1}$ reaches the flip-flop 14 of the first and second mux scan cells 11, 13. As a result, when operating in test mode, the present invention mux scan cell 40 will generate the exact same timing results as would be generated if there were no clock skew present. This can be easily verified by comparing the test mode timing diagram in FIG. 4A to the present invention test mode timing diagram in FIG. 4C.

Compared to the prior art, the present invention mux scan cell 40 uses a delay circuit 50 to help test data TD properly function in the presence of a clock skew. Accordingly, if the delay circuit 50 is adjusted properly, timing tests performed in test mode with clock skew give identical results as those generated without clock skew. The delay circuit 50 can be formed out of a variety of devices. A delay buffer, an RC circuit, a narrow width transistor, a wire delay, or other such devices can be used to form the delay circuit 50.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. a mux scan cell comprising:

a multiplexer comprising:
   a first input node for receiving raw data;
   a second input node for receiving test data;
   an output node for outputting data;
   a selection node for selecting an input from the first input node or the second input node; and
   a delay circuit electrically connected between the second input node and the output node for prolonging a traveling time which the test data takes to travel from the second input node to the output node; and a flip-flop connected to the output node of the multiplexer;

wherein the traveling time of the test data is prolonged such that the traveling time which the test data takes to travel from the second input node to the output node simulates a sum of a traveling time in which the raw data travels through a combinational logic and a traveling time in which the raw data travels from the first input node to the output node.

2. The mux scan cell of claim 1 being a mux scan cell of a plurality of sequentially connected mux scan cells which form a mux scan chain.

3. The mux scan cell of claim 2 wherein the flip-flop of the mux scan cell is electrically connected to a multiplexer of a following mux scan cell.

4. The mux scan cell of claim 1 wherein the delay circuit of the multiplexer comprises a delay buffer.

5. The mux scan cell of claim 1 wherein the delay circuit of the multiplexer comprises an RC circuit.

6. The mux scan cell of claim 1 wherein the delay circuit of the multiplexer comprises a narrow width transistor.

7. The mux scan cell of claim 1 wherein the delay circuit of the multiplexer comprises a wire delay.

* * * * *